(12) United States Patent
Lai et al.

(10) Patent No.: US 6,552,616 B1
(45) Date of Patent: Apr. 22, 2003

(54) ASYNCHRONOUS PHASE DETECTOR FOR A PLD INDEPENDENT OF TIMING REQUIREMENTS

(75) Inventors: David Lai, Mountain View, CA (US); Eugene Wang, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/816,948

(22) Filed: Mar. 22, 2001

(51) Int. Cl.[7] .................... H03L 7/085; H03D 13/00
(52) U.S. Cl. .................... 331/1 A; 331/25; 327/12; 327/159
(58) Field of Search .................... 331/1 A, 25, 27; 327/2, 3, 12, 156–159

(56) References Cited

U.S. PATENT DOCUMENTS 3,989,931 A  * 11/1976 Phillips ................... 235/92 FQ
4,339,731 A  *  7/1982 Adams ..................... 331/1 A
4,904,948 A  *  2/1990 Asami ..................... 328/133

OTHER PUBLICATIONS

Data Sheet: Cisco MGX 8850 AXSM Broadband ATM Switching Module, printed from website www.cisco.com, posted Jul. 3, 2000, 9 pgs.

* cited by examiner

Primary Examiner—David C. Mis
(74) Attorney, Agent, or Firm—Blakely, Sokoloff, Taylor & Zafman LLP (57) ABSTRACT

An apparatus and method of compensating for differences in circuit routing path lengths is described. In one embodiment, a latch is inserted between reset signal generating logic and a pair of flip-flops. When a reset signal is generated, the reset signal is held inside the latch until both flip-flops are reset. A latch reset signal may be generated by the flip-flops to clear the latch. The circuit may be configured to ensure that both flip-flops are reset before the reset signal is disabled.

21 Claims, 6 Drawing Sheets

ASYNCHRONOUS PHASE DETECTOR FOR A PLD INDEPENDENT OF TIMING REQUIREMENTS

FIELD OF THE INVENTION

This invention relates to the field of monolithic circuits and, in particular, to phase locked loop systems.

BACKGROUND

The phase-locked loop (PLL) concept has been used in communications systems for years. Until recently, however, phase-locked systems have been too complex and costly for use in most consumer and industrial systems, where performance requirements are less stringent and cost requirements more stringent. However, PLLs are increasingly being used in many applications such as stereo demodulators, tone detectors, frequency synthesizers, networking systems, and others.

A PLL is used to lock the frequency of an output signal to that of an input signal (e.g., a reference signal), where the frequency of the input signal varies over time. A PLL contains a phase detector, a loop filter, an amplifier, and a voltage-controlled oscillator (VCO). The VCO is an oscillator that generates a signal (e.g., a clock signal) whose frequency is proportional to an externally applied voltage. When the loop is locked on the reference signal, the VCO frequency is configured to be exactly equal to that of the input signal.

The phase detector is an asynchronous circuit that may be used to lock, or synchronize, the clock signal generated by the VCO to the reference clock signal. The phase detector compares the rising clock edges of the VCO clock signal and the reference clock signal and sends out a digital pulse to an analog loop filter. The loop filter converts the pulse into a voltage that may be used to control the voltage on the VCO in such a way as to bring the VCO frequency back to the same value as the input reference signal. Once the VCO is locked to the reference clock signal, the pulse from the phase detector is set at a fixed width.

Figure 1A:
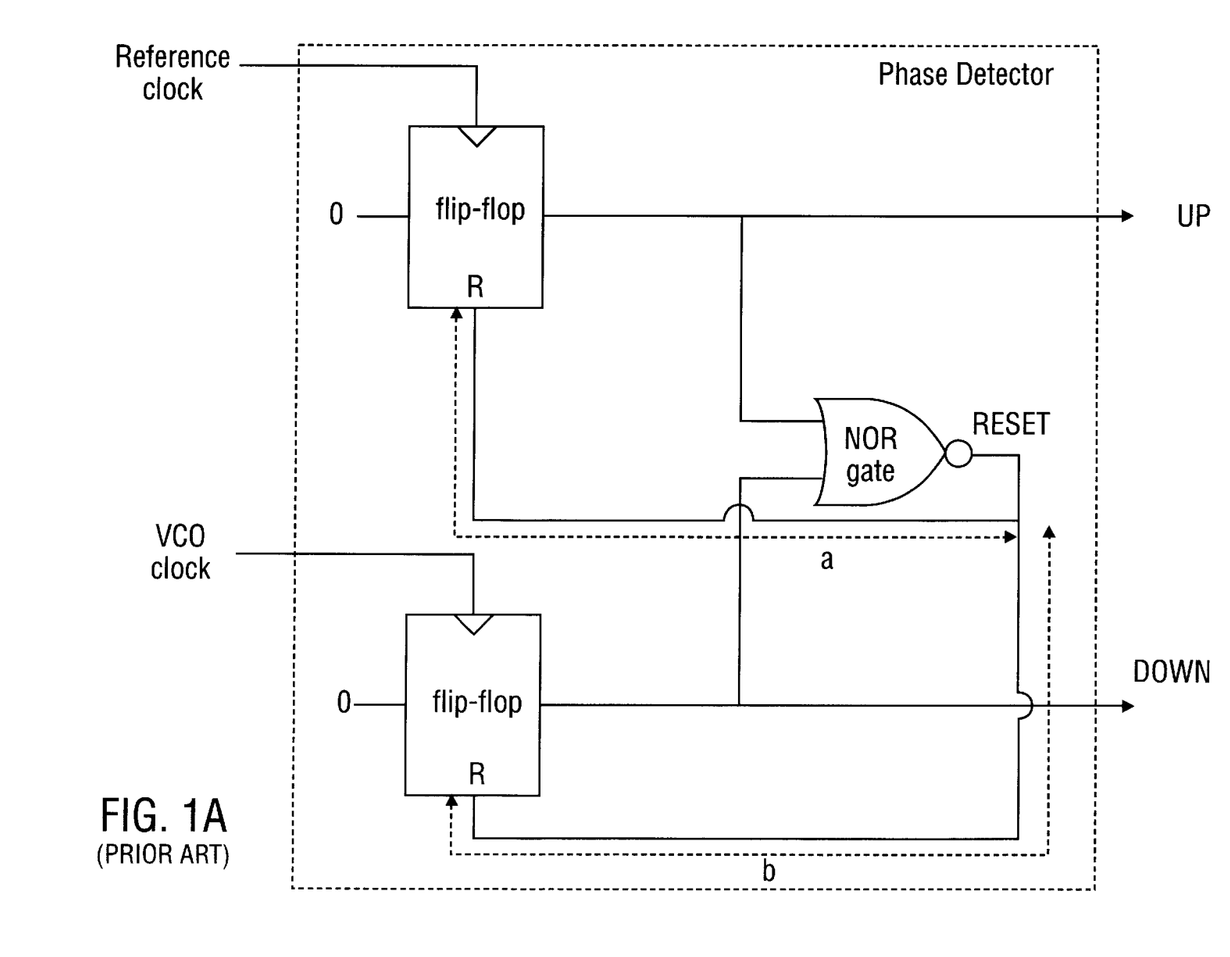
FIG. 1A illustrates one prior art phase detector.

FIG. 1A illustrates one prior art phase detector. Inside the phase detector are two flip-flops that are driven by either the VCO clock signal or the reference clock signal. A reset signal may be generated by the two flip-flops when the rising edge of both clock signals is detected. The reset signal is used to reset the two flip-flops.

One problem with such a phase detector circuit when implemented on a programmable logic device (PLD), such as field programmable gate array (FPGA), is that manufacturing process variations in the components of the circuit may cause differences in the propagation delay of the reset signal when routed to various blocks of the circuit. As a result, only one of the two flip-flops may be reset with the other flip-flop not being reset, thereby causing the reset signal to be disabled. When the next clock rising edge goes into the non-reset flip-flop, the clock rising edge cannot be detected.

For example, when the phase detector circuit receives a rising clock edge from the reference clock, the UP output signal goes to "0." Then, the circuit is waiting for the rising edge from the VCO clock. Once the rising edge of the VCO clock signal arrives, the DOWN output signal goes to "0" and causes the RESET signal to go to "1." The RESET signal resets both flip-flops back to "1," after which the circuit waits for the rising edges from the next clock cycle. When such a circuit is implemented in a large circuit design, there may be no way to control the routing of each segment of the RESET signal.

Figure 1B:
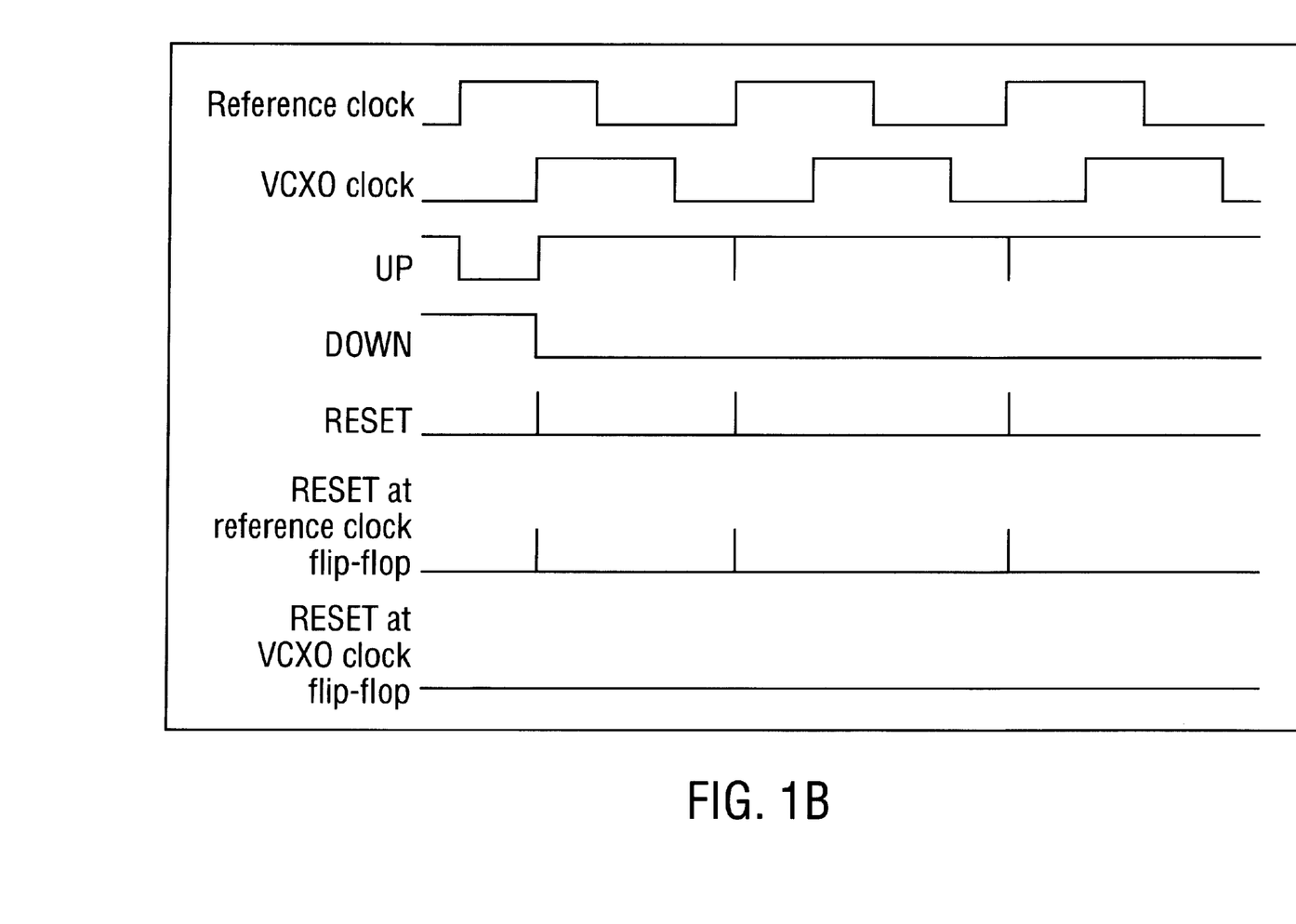
FIG. 1B is a timing diagram illustrating the timing relationships of signals in the phase detector of FIG. 1A having different RESET signal length segments.

FIG. 1B is a timing diagram illustrating the timing relationships of signals in the phase detector of FIG. 1A having different RESET signal length segments. If segment "a" of the RESET signal is routed much more shorter than segment "b," once RESET is enabled, the flip-flop for the reference clock is reset back to "1." This may cause the RESET to disable before the flip-flop for the VCO clock receives the RESET enable. As a possible result, the DOWN output signal may always be at "0" and, thus, the circuit cannot perform its intended function. Such routing problems may be especially prevalent when die-shrinking existing circuit designs.

SUMMARY OF THE INVENTION

The present invention pertains to an apparatus for and method of compensating for differences in routing path lengths in a phase detector. In one embodiment, the apparatus may include a first flip-flop having an output and a control input and a second flip-flop having an output and a control input. The apparatus also includes a first logic gate having an output, a first input coupled to the output of the first flip-flop, and a second input coupled to the output of the second flip-flop. The apparatus also includes a latch having a control input coupled to the output of the logic gate and an output coupled to the control inputs of the first and second flip-flops.

In one embodiment, the method may include receiving a first output from a first flip-flop and receiving a second output from a second flip-flop, and generating a first value for a reset signal based on the first and second outputs. The method also includes detecting a state change on the first and second outputs and holding the first value of the reset signal until the state change is detected on both the first and second outputs.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which.

DETAILED DESCRIPTION

In the following description, numerous specific details are set forth such as examples of specific circuits, components, parameters, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

An apparatus and method of compensating for differences in routing path lengths in a phase detector is described. In one embodiment, a latch is inserted between reset signal generating logic and a pair of flip-flops. When a reset signal is generated, the reset signal is held inside the latch until both flip-flops are reset. In one embodiment, a latch reset signal may be generated by the flip-flops to clear the latch. The circuit may be configured to ensure that both flip-flops are reset before the reset signal is disabled.

Figure 2:
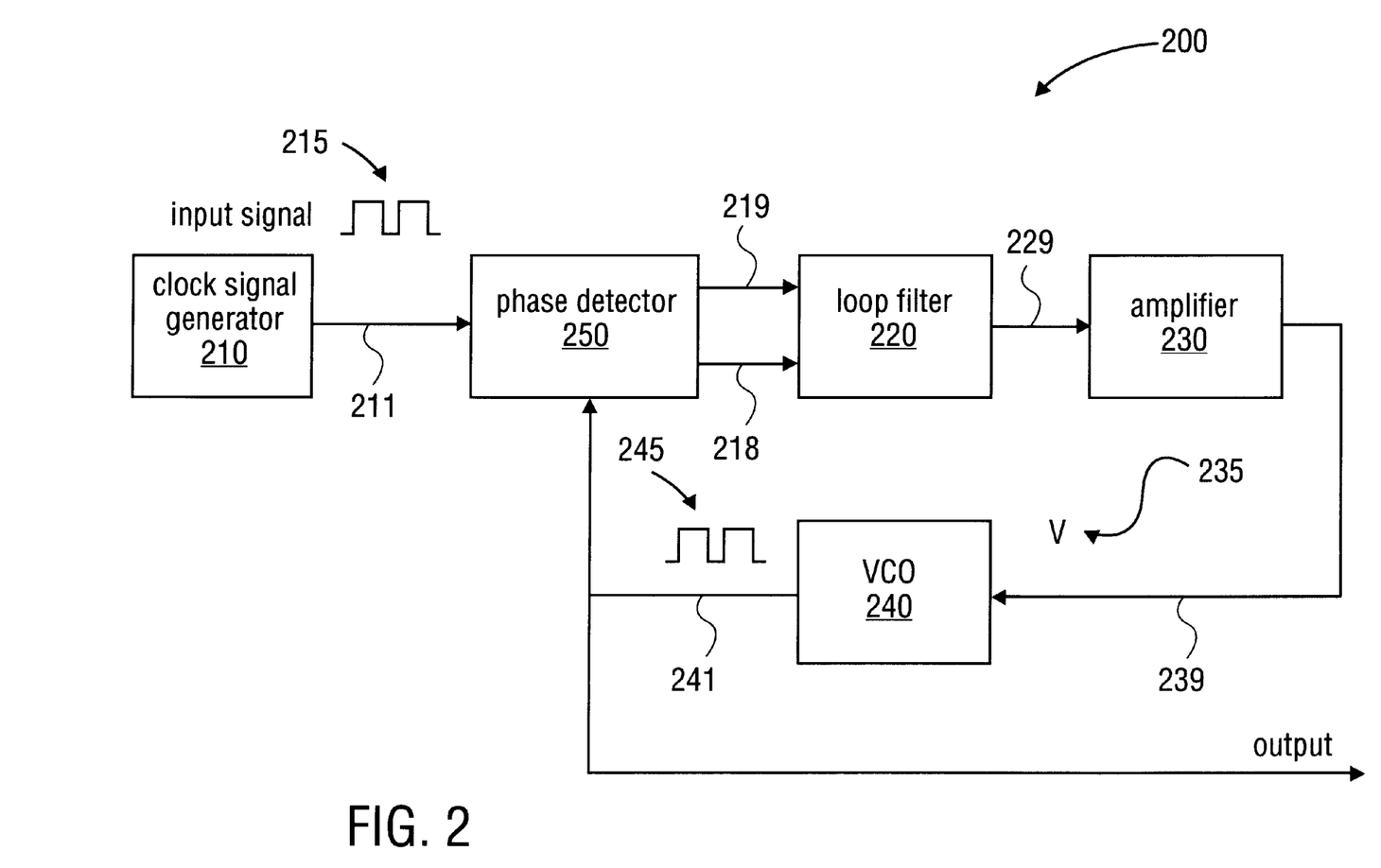
FIG. 2 illustrates a phase-locked loop system including one embodiment of a phase detector.

FIG. 2 illustrates a phase-locked loop system including one embodiment of a phase detector. In one embodiment, PLL system 200 may include phase detector 250, loop filter 220, amplifier 230, VCO 240, and clock signal generator 210. The output of the clock signal generator 210 is coupled to a first input of phase detector 250. The UP and DOWN signal outputs of phase detector 250 are coupled to the inputs of loop filter 220 via lines 219 and 218, respectively. The output of loop filter 220 is coupled to the input of amplifier 230 via line 229. The output of amplifier 230 is coupled to the input of VCO 240 on via line 239. The output of VCO 240 is provided as an external output of PLL 200 and is coupled to a second input of phase detector 250 via line 241.

In one embodiment, VCO 240 is an oscillator that generates a periodic clock signal 245 whose frequency is proportional to an externally applied voltage received from amplifier 230 on line 239. Phase detector 250 has a second input coupled to receive a reference clock signal 215 from a clock signal generator 210 on line 211. When the loop is locked on the reference clock signal 215, the frequency of VCO output signal 245 is equal to that of reference clock signal 215. Phase detector 250 produces a direct current (dc) or low frequency signal proportional to the phase difference between reference clock signal 215 and VCO output signal 245. The output of phase detector 250 is passed through loop filter 220 and amplifier 230 and applied to as a control voltage 235 to VCO 240 on line 239. Details of phase detector 250 are discussed below in relation to FIG. 3.

If, for example, the frequency of reference clock signal 215 shifts slightly, the phase difference between the VCO output signal 245 and the reference clock signal 215 begins to increase with time. This changes the control voltage 235 input to VCO 240 in such a way as to bring the VCO output signal 245 frequency back to the same value as reference clock signal 215. As such, VCO control voltage 235 is proportional to the frequency of reference clock signal 215. In this manner, PLL system 200 may maintain lock when the frequency of reference clock signal 215 changes. A clock signal generator, loop filter, amplifier, and VCO are known in the art; accordingly, a detailed discussion of them is not provided.

Figure 3:
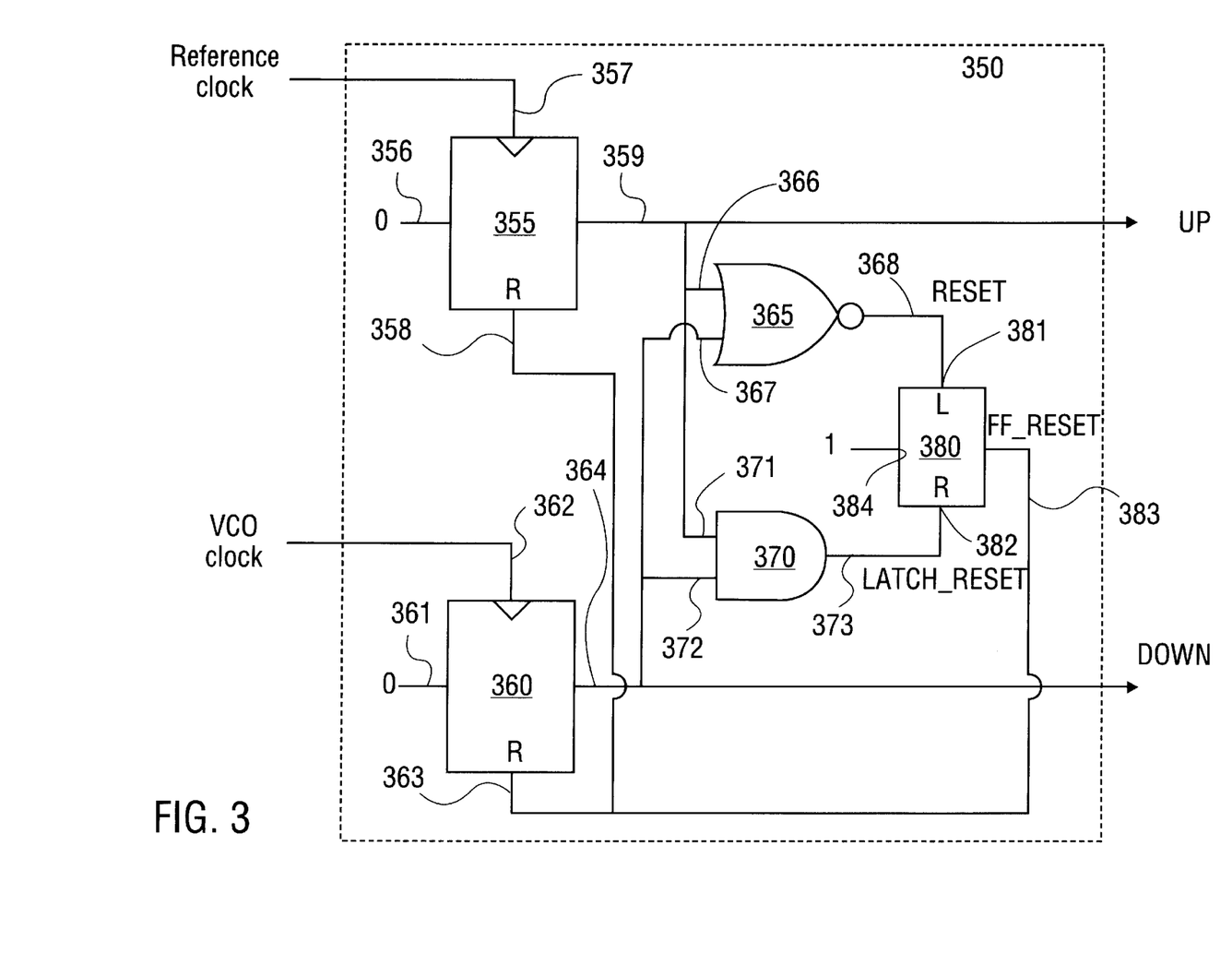
FIG. 3 illustrates one embodiment of a phase detector.

FIG. 3 illustrates one embodiment of a phase detector. In one embodiment, phase detector 350 may be the phase detector 250 of FIG. 2. Phase detector 350 may be implemented in various programmable logic devices (PLDs) such as a field programmable gate array (FPGA). Phase detector 350 may include flip-flops 355 and 360, NOR logic gate 365, AND logic gate 370, and latch 380. A logical 1 or 0 is called a bit (binary digit). Flip-flops 355 and 360 are static memory elements that hold, or register, a data value, or bit, until they are triggered by a clock signal. NOR logic gate 365 performs a not OR logical operation on the bit values applied to inputs 366 and 367, and generates the result of the logical operation on output 368. AND logic gate 370 performs an AND logical operation on the bits values applied to inputs 371 and 372 and generates the result of the logical operation on output 373. Flip-flops, NOR and NAND logic gates, and latches are well known in the art; accordingly, a detailed discussion of their operation is not provided herein.

Flip-flop 355 has an output 359, data input 356, a clock input 357, and a control input 358. Control input 358 is coupled to receive a reset signal (FF_RESET) to reset the flip-flop 355. Clock input 357 is coupled to receive a clock signal, for example, reference clock signal 215 from clock signal generator 210 of FIG. 2. Data is shifted into flip-flop 355 on input 356 and stored in flip-flop 355. The data is shifted out of flip-flop 355 on output 359. The data is shifted based on cycles of the clock signal received on clock input 357. In one embodiment, for example, data is shifted on the rising edge of a clock signal. The output 359 of flip-flop 355 is coupled to the inputs 366 and 371 of NOR gate 365 and AND gate 370, respectively.

Flip-flop 360 has a data input 361, a clock input 362, a reset input 363, and an output 364. Clock input 362 is coupled to receive a VCO clock signal, for example, clock signal 245 from VCO 240 of FIG. 2. The operation of flip-flop 360 may be similar to that of flip-flop 355 described above. The output 364 of flip-flop 360 is coupled to the inputs 367 and 372 of NOR gate 365 and AND gate 370, respectively.

The output 368 (RESET) of NOR gate 365 is coupled to the set input 381 of latch 380 and the output 373 (LATCH_RESET) of AND gate 370 is coupled to the reset input 382 of latch 380. The output 383 (FF_RESET) of latch 380 is coupled to reset inputs 358 and 363 of flip-flops 355 and 360, respectively.

In operation of phase detector 350, a logical 0 is applied to data inputs 356 and 361 of flip-flops 355 and 360, respectively. The logical 0 is shifted to output 359 (UP) and output 364 (DOWN) of flip-flops 355 and 360, respectively. When both UP and DOWN signals are 0, the logical operation of NOR gate 365 causes the RESET signal 368 to have a bit value of 1. A RESET bit value of 1 is applied to the set input 381 of latch 380 and causes the 1 on input 384 to be latched into latch 380. FF_RESET then has a bit value of 1 that is applied to reset both UP and DOWN to a bit value of 1 by resetting flip-flops 355 and 360. Even if there are path length differences in the routing circuitry of phase detector 350 (resulting in one of either UP or DOWN toggling before the other) that may cause the RESET 368 to toggle, the FF_RESET 383 will still hold a bit value of 1 until both UP and DOWN are reset to a bit value of 1. The logical operation performed by AND gate 370 causes LATCH_RESET 373 to have a bit value of 1, which causes latch 380 to clear (reset to a bit value of 0). As such, the state of the UP and DOWN signals are independent of routing or timing differences between their corresponding flip-flops feedback reset paths.

Figure 4:
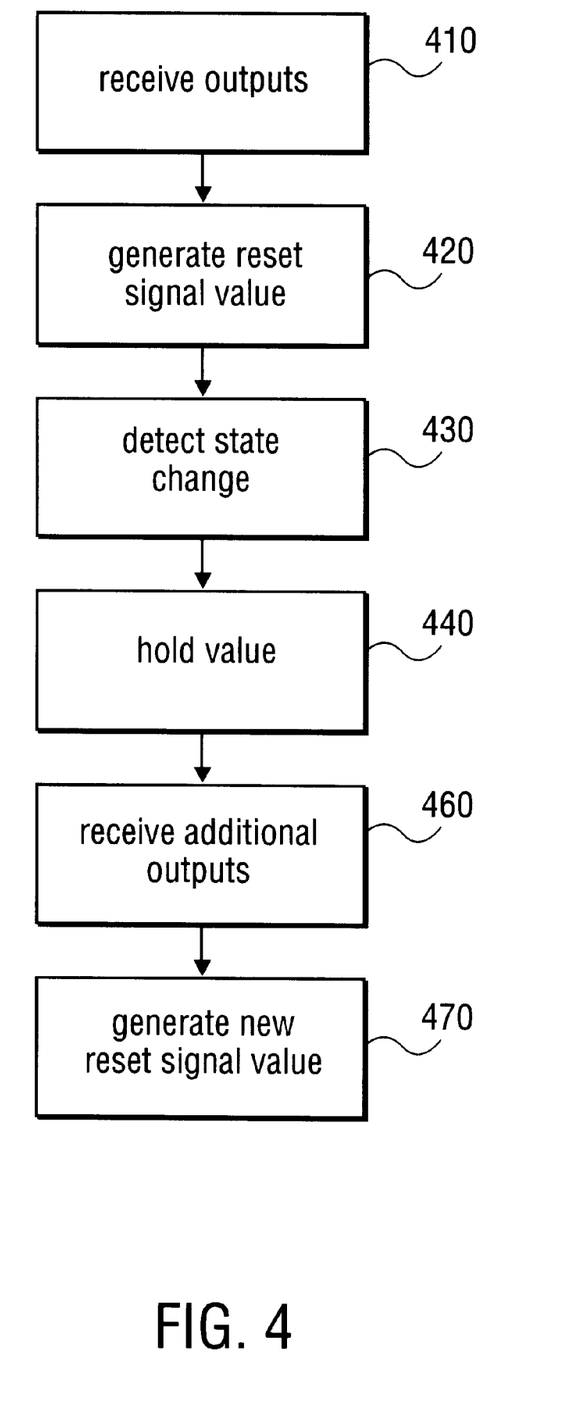
FIG. 4 illustrates one embodiment of a method of compensating for differences in routing path lengths in a phase detector.

FIG. 4 illustrates one embodiment of a method of compensating for differences in routing path lengths in a phase detector. In one embodiment, outputs from flip-flops 355 and 360 are received by logic circuits 365 and 370, respectively, step 410. A first value for a reset signal is generated based on the received outputs, step 420. The outputs of the flip-flops 355 and 360 may be monitored to detect a state change on the outputs, step 430, with the first value of the reset signal held until the state change is detected on both outputs.

In one embodiment, additional outputs may be received from the flip-flops 355 and 360, step 440. A second value for the reset signal may then be generated by performing logical operations on the additional outputs.

Figure 5:
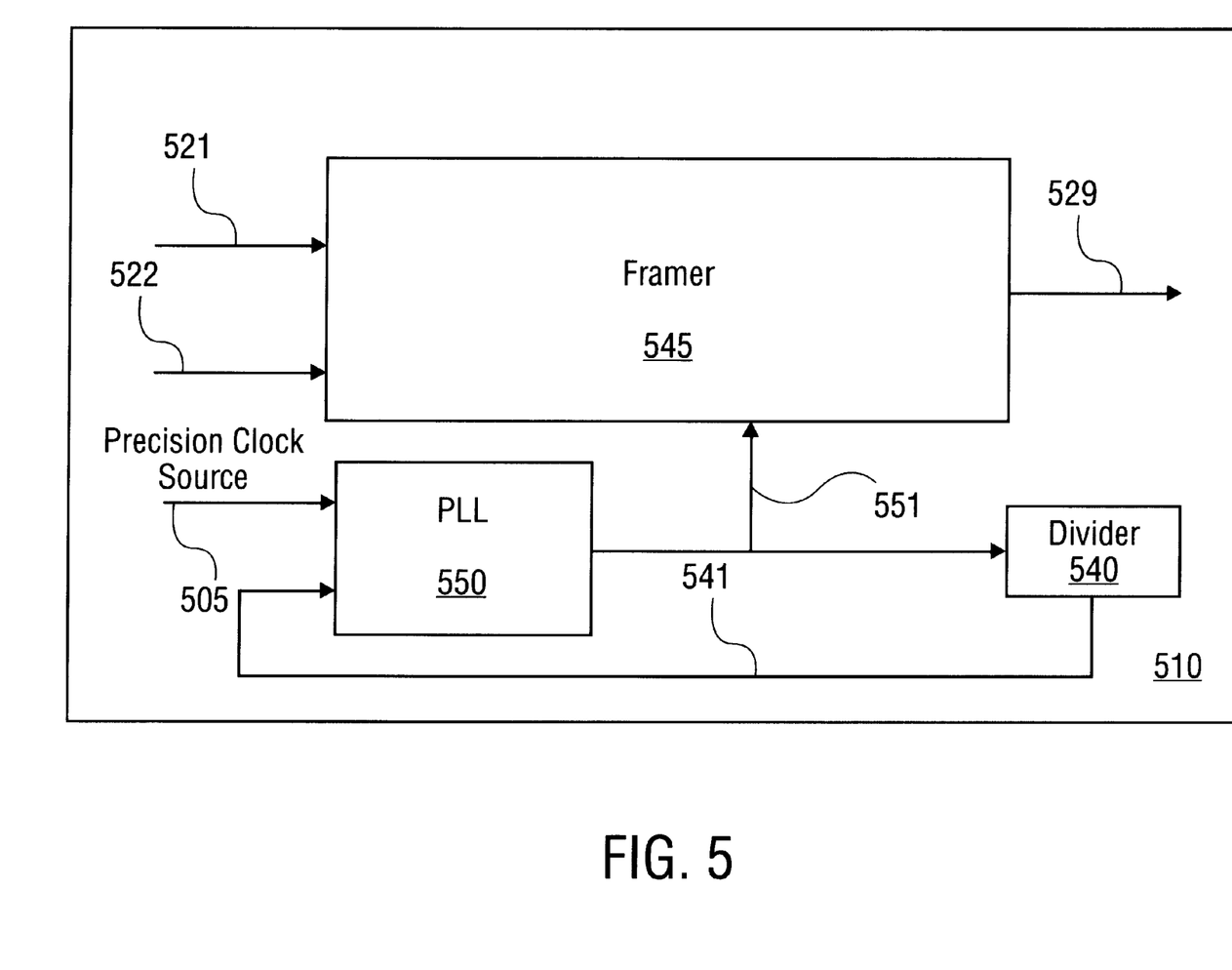
FIG. 5 illustrates one embodiment of a switch that includes the PLL shown in FIG. 2.

FIG. 5 illustrates one embodiment of a switch that includes the PLL of FIG. 2. Switch 510 may include a framer 545, a PLL 550, and a divider 540. Framer 545 is coupled to receive data on line 521 at one frequency and a clock signal 522 having a frequency similar to the frequency of the received data.

Data, in the form of packets, is transmitted along a data path through switch 510. The data path is the structural portion of the switch which, under the influence of control, manipulates and passes data from line 521 to line 529. Framer 545 formats the data received on one network (e.g., a digital signal network) having a particular packet structure into another packet protocol structure that is conducive to transmission on another network (e.g., an optical carrier network). Packets that are received by framer 545 on line 521 may arrive faster than the throughput capacity of switch 510 and may result in a dropped transmission.

Framer 545 may operate to buffer the received data stream in order to handle packet overloads and frame packets according to a framing specification. The framing specification is a specification of the "protocol bits" that surround the "data bits" to allow the data to be "framed" into segments. The framing 545 operates to gather bytes in the received packets that may arrive arbitrarily in time and align them to achieve packed bytes. Framers are known in the art; accordingly, a detailed discussion is not provided.

Framer 545 is configured to output data on line 529 at a different frequency than that of the data received on line 521. The output of PLL 550 is coupled to framer 545 via line 551. PLL 550 may be used to synchronize the data received on line 521 with a precision clocking source (e.g., a Stratum clock source) signal having a frequency similar to that required for transmission on line 529. The precision clock source signal is received by PLL 550 via line 505. For example, if data is received on line 521 at a rate of 50 MHz and output on line 529 at 77.76 MHz, then line 522 is coupled to a 50 MHz clock source and PLL is configured to output a signal at 77.76 MHz.

In one embodiment, the precision clock source may operate at a different frequency than that required for output data transmission. In such an embodiment, the precision clock source signal may be adjusted to generate the desired frequency. For example, if the precision clocking source operates with a lower frequency (e.g., 19.44 MHz) than that needed for output transmission (e.g., 77.76 MHz), then PLL 550 may include a frequency multiplier. In such a situation, switch 510 includes a frequency divider 540 coupled to the output of PLL 550 that operates to divide down the frequency for the feedback input 541 to PLL 550.

In one embodiment, switch 510 may be used in an asynchronous transfer mode (ATM) switching module and combined with a processor to switch data between transmission line mediums and optical mediums such as T-carrier/E-carrier digital transmission lines (e.g., T3/E3) and fiber optic lines. As such, line 521 may be coupled to receive data from a digital transmission line and line 529 may be coupled to transmit data on a fiber optic line.

Computer systems communicate with each other using a variety of networks and corresponding protocols such an Internet Protocol (IP), Synchronous Optical Network (SONET), and Optical Carrier (OC). SONET is the United States standard for synchronous data transmission on optical media. The international equivalent of SONET is synchronous digital hierarchy (SDH). Together, they ensure standards so that digital networks can interconnect internationally and that existing conventional transmission systems can take advantage of optical media. OC is a series of physical protocols (e.g., OC-1, OC-2, OC-3, etc.) defined for SONET optical signal transmissions. OC signal levels put Synchronous Transport Module (STM) frames onto fiber optic lines at a variety of speeds.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
a first flip-flop having an output and a control input;
a second flip-flop having an output and a control input;
a first logic gate having a first input coupled to the output of the first flip-flop and a second input coupled to the output of the second flip-flop, the first logic gate having an output, wherein the first logic gate is a NOR gate; and
a latch having a control input coupled to the output of the logic gate, the latch having an output coupled to the control inputs of the first and second flip-flops, wherein the latch holds a first value until both the outputs of the first and second flip-flops have the same value.

2. The apparatus of claim 1, wherein the latch holds a first value until both the outputs of the first and second flip-flops have the same value.

3. The apparatus of claim 1, wherein the second flip-flop has a clock input coupled to receive an oscillator clock signal.

4. The apparatus of claim 1, wherein the first flip flop has a clock input coupled to receive a reference clock signal.

5. The apparatus of claim 1, wherein the first value is a logical 1 and the same value of the first and second flip-flop outputs is a logical 1.

6. The apparatus of claim 1, further comprising:
a second logic gate having a first input coupled to the output of the first flip-flop and a second input coupled to the output of the second flip-flop, the second logic gate having an output coupled to the latch.

7. The apparatus of claim 6, wherein the second logic gate is an AND gate and wherein the AND gate operates to clear the latch.

8. A method, comprising:
receiving a first output from a first flip-flop by a NOR gate;
receiving a second output from a second flip-flop by the NOR gate;
generating a first value for a reset signal by the NOR gate based on the first and second outputs;
detecting a state change on the first and second outputs; and
holding the first value of the reset signal until the state change is detected on both the first and second outputs.

9. The method of claim 8, wherein the state change indicates that the first and second flip-flops are reset.

10. The method of claim 8, wherein detecting a state change comprises:
receiving a third output from the first flip-flop;
receiving a fourth output from the second flip-flop; and generating a second value for the reset signal by performing logical operations on the third and fourth outputs.

11. The method of claim 10, wherein the first and second outputs have a bit value of 0.

12. The method of claim 10, wherein the third and fourth outputs have a bit value of 1.

13. The method of claim 10, further comprising changing the reset signal to have the first value.

14. An apparatus, comprising:
   a phase detector; and
   means for resetting an output of said phase detector independent of routing path lengths between components internal to said phase detector, wherein the means for resetting comprises a latch disposed between a NOR gate and first and second flip-flops to receive a reset signal and hold the reset signal until both the first and second flip-flops are reset.

15. The apparatus of claim 14, further comprising means for clearing the latch.

16. A phase locked loop, comprising:
   a voltage controlled oscillator; and
   a phase detector coupled to the voltage controlled oscillator, the phase detector comprising:
      a first flip-flop having an output and a control input;
      a second flip-flop having an output and a control input;
      a first logic gate having a first input coupled to the output of the first flip-flop and a second input coupled to the output of the second flip-flop, the first logic gate having an output, wherein the first logic gate is a NOR gate; and
      a latch having a control input coupled to the output of the logic gate, the latch having an output coupled to the control inputs of the first and second flip-flops, wherein the latch holds a first value until both the outputs of the first and second flip-flops have the same value.

17. The phase locked loop of claim 16, wherein the phase detector further comprises a second logic gate having a first input coupled to the output of the first flip-flop and a second input coupled to the output of the second flip-flop, the second logic gate having an output coupled to the latch.

18. The phase locked loop of claim 17, wherein the second logic gate is an AND gate and wherein the AND gate operates to clear the latch.

19. A switch, comprising:
   a framer; and
   a phase locked loop coupled to the framer, the phase locked loop comprising:
      a voltage controlled oscillator; and
      a phase detector coupled to the voltage controlled oscillator, the phase detector comprising:
         a first flip-flop having an output and a control input;
         a second flip-flop having an output and a control input;
         a first logic gate having a first input coupled to the output of the first flip-flop and a second input coupled to the output of the second flip-flop, the first logic gate having an output, wherein the first logic gate is a NOR gate; and
         a latch having a control input coupled to the output of the logic gate, the latch having an output coupled to the control inputs of the first and second flip-flops, wherein the latch holds a first value until both the outputs of the first and second flip-flops have the same value.

20. The switch of claim 19, wherein the phase detector further comprises a second logic gate having a first input coupled to the output of the first flip-flop and a second input coupled to the output of the second flip-flop, the second logic gate having an output coupled to the latch.

21. The switch of claim 19, wherein the second logic gate is an AND gate and wherein the AND gate operates to clear the latch.

* * * * *